US012650650B2

(12) United States Patent
Huang et al.

(10) Patent No.: US 12,650,650 B2
(45) Date of Patent: Jun. 9, 2026

(54) SYSTEM AND METHOD FOR CLEANING AN EUV MASK WITHIN A SCANNER

(71) Applicant: Taiwan Semiconductor Manufacturing Co., Ltd., Hsinchu (TW)

(72) Inventors: Yuru Huang, Hsinchu (TW); Chueh-Chi Kuo, Hsinchu (TW); Tzung-Chi Fu, Hsinchu (TW); Chieh-Jen Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/477,977

(22) Filed: Sep. 17, 2021

(65) Prior Publication Data

US 2022/0299882 A1    Sep. 22, 2022

Related U.S. Application Data

(60) Provisional application No. 63/163,407, filed on Mar. 19, 2021.

(51) Int. Cl.
*G03F 7/00* (2006.01)
*G03F 1/82* (2012.01)
*G03F 1/84* (2012.01)

(52) U.S. Cl.
CPC ............ *G03F 7/70033* (2013.01); *G03F 1/82* (2013.01); *G03F 1/84* (2013.01); *G03F 7/70741* (2013.01); *G03F 7/70925* (2013.01)

(58) Field of Classification Search
CPC ........... G03F 1/82; G03F 1/84; G03F 7/70925
See application file for complete search history.

(56) References Cited

U.S. PATENT DOCUMENTS

| | | | | |
|---|---|---|---|---|
| 5,634,230 A | * | 6/1997 | Maurer | G03F 1/82 |
| | | | | 15/312.1 |
| 6,038,015 A | * | 3/2000 | Kawata | G03F 1/84 |
| | | | | 134/1 |
| 6,124,718 A | * | 9/2000 | Kawata | B82Y 40/00 |
| | | | | 355/53 |
| 2004/0090605 A1 | * | 5/2004 | Yogev | H01L 21/67017 |
| | | | | 250/559.4 |

(Continued)

FOREIGN PATENT DOCUMENTS

| | | | | |
|---|---|---|---|---|
| JP | H03-71779 B2 | * | 11/1991 | |
| JP | 2014220495 A | * | 11/2014 | |
| WO | WO-02052345 A1 | * | 7/2002 | G03F 1/82 |

OTHER PUBLICATIONS

Translation of JP 2014220495 A (Year: 2014).*
Machine translation of WO-02052345-A1 (Year: 2002).*
Machine translation of JP H03-71779 B2 (Year: 1991).*

*Primary Examiner* — Steven H Whitesell
(74) *Attorney, Agent, or Firm* — Seed IP Law Group

(57) ABSTRACT

An extreme ultraviolet (EUV) photolithography system includes a scanner. Photolithography system performs EUV photolithography processes with a reticle in the scanner. The scanner includes a reticle storage chamber, a reticle backside inspection chamber, and a reticle cleaning chamber. The reticle cleaning chamber cleans debris from the backside of the reticle within the scanner.

20 Claims, 11 Drawing Sheets

(56)        References Cited

U.S. PATENT DOCUMENTS

2007/0121092 A1\*  5/2007  Mochizuki ........ H01L 21/67772
                                                  355/75
2007/0146657 A1\*  6/2007  Mierlo ...................... G03F 1/24
                                                  355/53
2011/0180108 A1\*  7/2011  Pan ................... H01L 21/67389
                                                  134/115 R
2014/0268074 A1\*  9/2014  Chien ................. G03F 7/70741
                                                  355/30
2015/0241797 A1\*  8/2015  Onvlee .............. G03F 7/70925
                                                  134/6
2016/0158807 A1\*  6/2016  Robinson .............. B82Y 30/00
                                                  15/104.001
2017/0060005 A1\*  3/2017  Chang ................. G03F 7/70866
2020/0019072 A1\*  1/2020  Wu ......................... G03F 7/707
2020/0035483 A1\*  1/2020  Huang ............. H01L 21/02057

\* cited by examiner

124

127

Optical
Measurement
System

132

130

132

131

129

144

H1

134

136

108

142

140

142

Z
X

Optical Measurement System

127

130

132

132

124

134

146

140

108

H2

142

136

142

142

X

Z

127

Optical
Measurement
System

129

131

132

130

134

136

108

142

140

132

142

124

X

Z

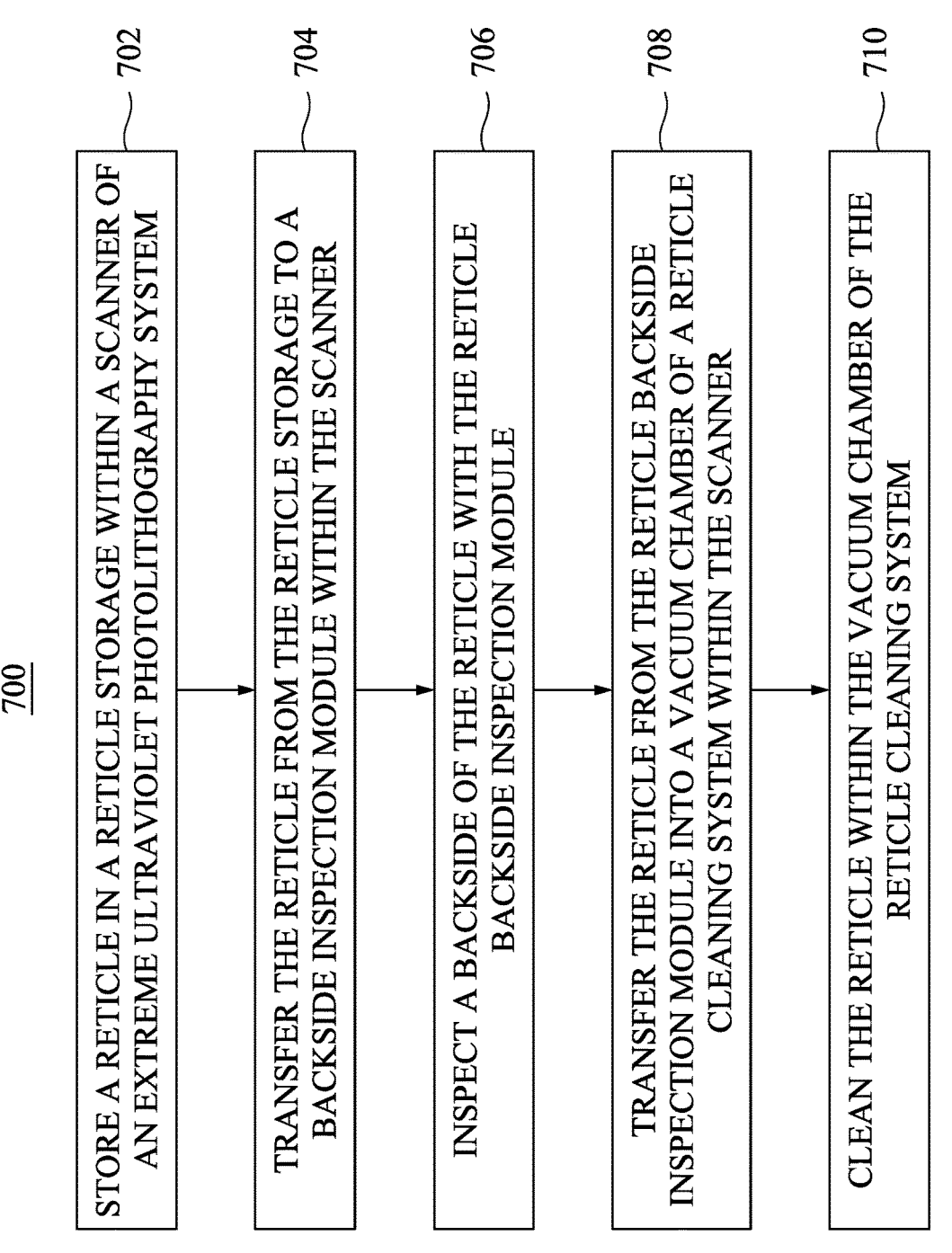

700

STORE A RETICLE IN A RETICLE STORAGE WITHIN A SCANNER OF AN EXTREME ULTRAVIOLET PHOTOLITHOGRAPHY SYSTEM
702

TRANSFER THE RETICLE FROM THE RETICLE STORAGE TO A BACKSIDE INSPECTION MODULE WITHIN THE SCANNER
704

INSPECT A BACKSIDE OF THE RETICLE WITH THE RETICLE BACKSIDE INSPECTION MODULE
706

TRANSFER THE RETICLE FROM THE RETICLE BACKSIDE INSPECTION MODULE INTO A VACUUM CHAMBER OF A RETICLE CLEANING SYSTEM WITHIN THE SCANNER
708

CLEAN THE RETICLE WITHIN THE VACUUM CHAMBER OF THE RETICLE CLEANING SYSTEM
710

Fig. 7

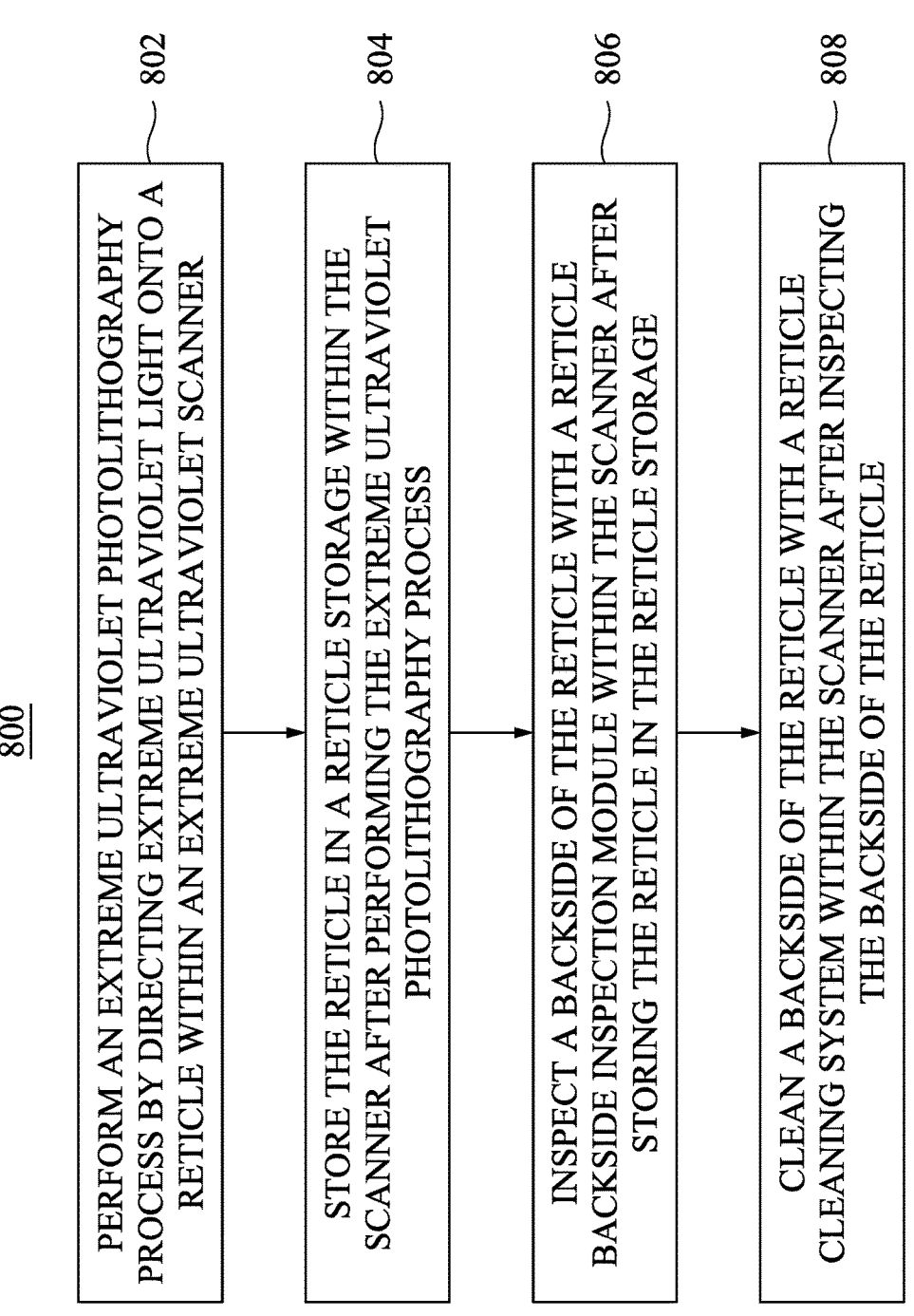

800

PERFORM AN EXTREME ULTRAVIOLET PHOTOLITHOGRAPHY PROCESS BY DIRECTING EXTREME ULTRAVIOLET LIGHT ONTO A RETICLE WITHIN AN EXTREME ULTRAVIOLET SCANNER

802

STORE THE RETICLE IN A RETICLE STORAGE WITHIN THE SCANNER AFTER PERFORMING THE EXTREME ULTRAVIOLET PHOTOLITHOGRAPHY PROCESS

804

INSPECT A BACKSIDE OF THE RETICLE WITH A RETICLE BACKSIDE INSPECTION MODULE WITHIN THE SCANNER AFTER STORING THE RETICLE IN THE RETICLE STORAGE

806

CLEAN A BACKSIDE OF THE RETICLE WITH A RETICLE CLEANING SYSTEM WITHIN THE SCANNER AFTER INSPECTING THE BACKSIDE OF THE RETICLE

SYSTEM AND METHOD FOR CLEANING AN EUV MASK WITHIN A SCANNER

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet (EUV) light is used to produce particularly small features due to the relatively short wavelength of EUV light. For example, EUV light is typically produced by irradiating droplets of selected materials with a laser beam. The energy from the laser beam causes the droplets to enter a plasma state. In the plasma state, the droplets emit EUV light. The EUV light travels toward a collector with an elliptical or parabolic surface. The collector reflects the EUV light to a scanner. The scanner illuminates the target with the EUV light via a reticle. However, due to the miniscule size of features to be transferred from the reticle to the integrated circuits, if even very small particles or debris fall onto the face of the reticle, then the photolithography processes may be corrupted and the resulting integrated circuits will not be functional.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flow diagram of a method for operating an EUV photolithography system, in accordance with some embodiments.

FIG. 8 is a flow diagram of a method for operating an EUV photolithography system, in accordance with some embodiments.

DETAILED DESCRIPTION

Figure 1:
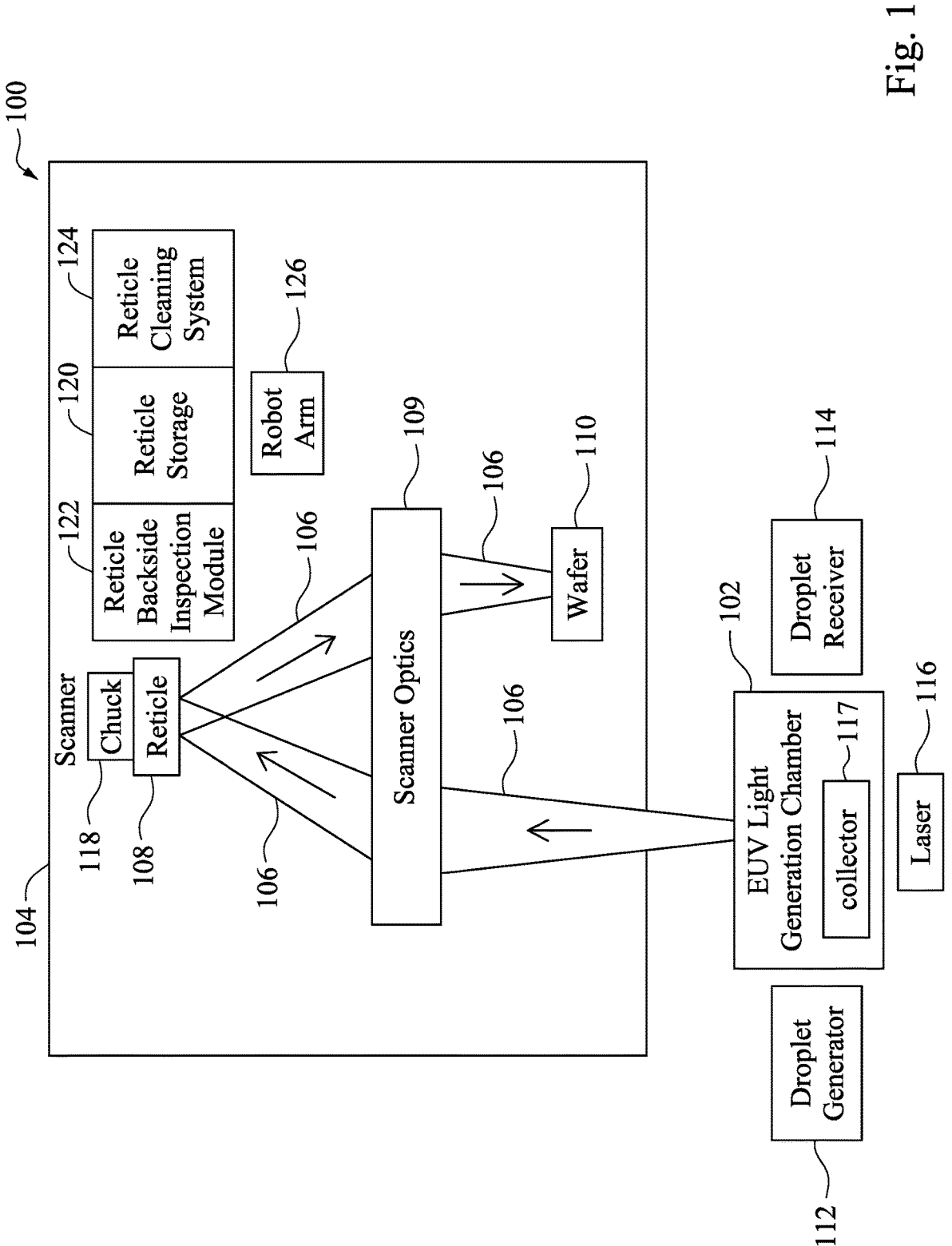
FIG. 1 is a block diagram of an EUV photolithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure effectively and efficiently remove particles and other contaminants from an EUV reticle. Prior to a photolithography process, the reticle is inspected by a backside inspection module. If the backside inspection module detects debris particles on the reticle, then reticle is transferred to a reticle cleaning system positioned within the scanner. The reticle cleaning system cleans or removes the particles from the reticle. The reticle is then transferred back to the backside inspection module. If the backside inspection module determines that there are no debris particles, then the reticle is loaded into the chuck for an EUV photolithography process.

Embodiments of the present disclosure provide many benefits to EUV photolithography systems. Because the reticle cleaning system is advantageously positioned within the scanner, the reticle does not need to be removed from the scanner environment in order to clean the reticle. Removing the reticle from the scanner to clean the reticle is a very expensive and time-consuming process. The reticle cannot be used for EUV processes for a very long time. Accordingly, the reticle cleaning system positioned within the scanner environment saves enormous amounts of time and resources. When the reticle is rejected by the inspection module, the reticle is quickly cleaned within the scanner environment by the reticle cleaning system. The result is that cleaning processes are performed quickly and the EUV reticle is available for EUV photolithography processes in a very short amount of time. Furthermore the cleaning process is very effective, so EUV photolithography processes will not be disrupted or corrupted by the presence of debris on the reticle.

FIG. 1 is a block diagram of an EUV photolithography system 100, according to some embodiments. The components of the EUV photolithography system 100 cooperate to generate EUV light and perform photolithography processes. As will be set forth in more detail below, the photolithography system utilizes a reticle cleaning system positioned within a scanner to quickly and efficiently clean particles from a photolithography reticle. As used herein, the terms "EUV light" and "EUV radiation" can be used interchangeably.

The EUV photolithography system 100 includes an EUV light generation chamber 102 and a scanner 104. EUV light 106 is generated within the EUV light generation chamber 102. The EUV light 106 is passed from the EUV light generation chamber 102 into the scanner 104. The scanner 104 includes a reticle 108 and scanner optics 109. The EUV light 106 is directed by the scanner optics 109 onto the reticle 108. The EUV light 106 reflects off the reticle 108 and is directed by the scanner optics 109 onto a wafer 110. The reticle 108 includes a photolithography mask pattern. When the EUV light 106 reflects off of the reticle 108, the EUV light 106 carries the mask pattern. The EUV light 106 patterns a layer on the wafer 110 in accordance with the pattern of the reticle 108. Each of these processes is described in more detail below.

The EUV photolithography system 100 includes a droplet generator 112 and a droplet receiver 114. The droplet generator 112 generates and outputs a stream of droplets. The droplets can include tin, though droplets of other material can be utilized without departing from the scope of the present disclosure. The droplets move at a high rate of speed toward the droplet receiver 114. The droplets have an average velocity between 60 m/s to 200 m/s. The droplets have a diameter between 10 μm and 200 μm. The generator may output between 1000 and 100000 droplets per second. The droplet generator 112 can generate droplets having different initial velocities and diameters than those described above without departing from the scope of the present disclosure.

In some embodiments, the EUV light generation chamber 104 is a laser produced plasma (LPP) EUV light generation system. As the droplets travel through the EUV light generation chamber 104 between the droplet generator 112 and the droplet receiver 114, the droplets are irradiated by the laser 116. When a droplet is irradiated by the laser 116, the energy from the laser 116 causes the droplet to form a plasma. The plasmatized droplets generate EUV light 106. This EUV light 106 is collected by the collector 117 and passed to the reticle 108 and then on to the wafer 110.

In some embodiments, the laser 116 is positioned external to the EUV light generation chamber 104. During operation, the laser 116 outputs pulses of laser light into the EUV light generation chamber 104. The pulses of laser light are focused on a point through which the droplets pass on their way from the droplet generator 112 to the droplet receiver 114. Each pulse of laser light is received by a droplet. When the droplet receives the pulse of laser light, the energy from the laser pulse generates a high-energy plasma from the droplet. The high-energy plasma outputs EUV light 106.

In some embodiments, the laser 116 irradiates the droplet with two pulses. A first pulse causes the droplet to flatten into a disk like shape. The second pulse causes the droplet to form a high temperature plasma. The second pulse is significantly more powerful than the first pulse. The laser 116 and the droplet generator 112 are calibrated so that the laser emits pairs of pulses such that the droplet is irradiated with a pair of pulses. The laser can irradiate droplets in a manner other than described above without departing from the scope of the present disclosure. For example, the laser 116 may irradiate each droplet with a single pulse or with more pulses than two. In some embodiments, there are two separate lasers. A first laser delivers the flattening pulse. A second laser delivers the plasmatizing pulse.

In some embodiments, the light output by the droplets scatters randomly in many directions. The photolithography system 100 utilizes the collector 117 to collect the scattered EUV light 106 from the plasma and direct or output the EUV light 106 toward the scanner 108.

The scanner 108 includes scanner optics 109. The scanner optics 109 include a series of optical conditioning devices to direct the EUV light 106 to the reticle. The scanner optics 109 may include refractive optics such as a lens or a lens system having multiple lenses (zone plates). The scanner optics 109 may include reflective optics, such as a single mirror or a mirror system having multiple mirrors. The scanner optics 109 direct the ultraviolet light from the EUV light generation chamber 104 to a reticle.

The EUV light 106 reflects off of the reticle 108 back toward further optical features of the scanner optics 109. In some embodiments, the scanner optics 109 include a projection optics box. The projection optics box may have refractive optics, reflective optics, or combination of refractive and reflective optics. The projection optics box may include a magnification less than 1, thereby reducing the patterned image included in the EUV light 106 reflected from the reticle. The projection optics box directs the EUV light 106 onto the wafer 110, for example, a semiconductor wafer.

The EUV light 106 includes a pattern from the reticle 108. In particular, the reticle 108 includes the pattern to be defined in the wafer 110. After the EUV light 106 reflects off of the reticle 108, the EUV light 106 contains the pattern of the reticle 108. A layer of photoresist typically covers the target during extreme ultraviolet photolithography irradiation. The photoresist assists in patterning a surface of the semiconductor wafer in accordance with the pattern of the reticle 108.

The effectiveness of the photolithography processes depends, in part, on the amount of EUV light that is generated, how much of the EUV light reaches the reticle 108, and how effectively the EUV light 106 carries the pattern of the reticle 108 after reflecting from the reticle 108. If any of these aspects of the photolithography process are negatively affected, then the photolithography process itself may be less effective or ineffective.

As set forth above, the EUV light 106 carries the pattern of the reticle 108 after reflecting from the reticle 108. However, if there are debris particles on the surface of the reticle 108, then the EUV light 106 may not properly carry the pattern of the reticle 108 to the wafer 110. Instead, the EUV light 106 will carry a pattern that includes the shape of the debris particles present on the exposure surface of the reticle 108.

The reticle 108 includes an exposure side and a backside. In the example of FIG. 1, the exposure side faces downward. EUV light 106 is received at the exposure side of the reticle 108. Patterning of the wafer 110 may be particularly sensitive to the presence of debris particles on the exposure side of the reticle 108. Debris particles on the exposure side of the reticle 108 can prevent the EUV light 106 from properly carrying the pattern of the reticle 108.

The photolithography processes are also sensitive to debris particles on the backside of the reticle 108. During photolithography processes, the reticle 108 is held in the scanner by the chuck 118. When the reticle 108 is loaded into the scanner 104 for a photolithography process, the chuck 118 holds the backside of the reticle 108 so that the exposure side of the reticle 108 is facing downward. The chuck 118 may hold the reticle 108 by electrostatic force, by clamps, or by other mechanisms or forces. The backside of the reticle 108 may be in direct contact with a bottom surface of the chuck 118. If there are debris particles on the backside of the reticle 108 when the reticle 108 is loaded into the chuck 118, then the reticle 108 may not lie entirely flat against the bottom surface of the chuck 118. The reticle 108 may thus be oriented at an angle other than normal to vertical. This can result in the EUV light 106 being directed onto the wafer 110 at an angle that does not result in the proper pattern being imparted to the wafer 110. Furthermore, the pattern carried by the EUV light 106 can also be affected by the presence of debris particles on the backside of the reticle 108. While the description of figures are directed primarily to addressing the identification and removal of debris particles on the backside of the reticle 108, principles of the present disclosure extend also to the identification and removal of debris particles on the exposure side of the reticle 108.

Before continuing with a discussion of detection and removal of debris particles from the reticle 108, it is beneficial to discuss storage and handling of the reticle 108 between photolithography processes. The scanner 104 includes a reticle storage 120. The reticle storage 120 may also be termed a reticle handling chamber. The reticle storage 120 is positioned within the scanner 104. One reason that the reticle storage 120 is positioned within the scanner 104 is to avoid subjecting the reticle 108 to possible contamination by moving the reticle 108 to and from the scanner 104 between photolithography processes.

In some embodiments, while the reticle 108 is stored in the reticle storage 120, the reticle 108 is enclosed within an EUV pod. The EUV pod is a storage and protection pod that encloses and protects the reticle 108 when the reticle 108 is not in use. After the reticle 108 has been initially manufactured, the reticle 108 may immediately be enclosed in the EUV pod. The reticle 108 remains in the EUV pod during transport from the manufacturing site to the wafer processing site. The reticle 108 remains in the EUV pod within the reticle storage 120 until the reticle 108 is to be utilized in the EUV photolithography process. At this time, the reticle 108 is transferred from the EUV pod into the scanner 104. The EUV pod, or portions of the EUV pod may be carried into the scanner 104. The reticle 108 is then unloaded from the EUV pod onto the chuck 118. The chuck holds the reticle 108 during the EUV process. After the EUV process, the reticle 108 is unloaded from the chuck to the EUV pod. The EUV pod is designed to ensure that no particles can contaminate the reticle 108 when the reticle 108 is not in use.

The EUV photolithography system 100 includes a reticle backside inspection module 122 positioned within the scanner 104. Before the reticle 108 can be utilized in a photolithography process, the reticle 108 is passed to the reticle backside inspection module 122. The reticle backside inspection module 122 inspects the backside of the reticle 108 to determine whether there are debris particles present on the backside of the reticle 108. If there are debris particles present on the backside of the reticle 108, then the reticle backside inspection module 122 rejects the reticle 108. Rejection of the reticle 108 means that the reticle 108 will not be loaded into the chuck 118 until debris particles have been removed from the backside of the reticle 108. Accordingly, the reticle backside inspection module 122 acts as a safety check to ensure that the reticle 108 is not loaded into the chuck 118 for a photolithography process if there are debris particles present on the backside of the reticle 108.

The reticle backside inspection module 122 is positioned adjacent to the reticle storage 120 within the scanner 104. Because the reticle backside inspection module 122 is positioned within the scanner 104, backside inspections can be done quickly without transferring the reticle 108 outside of the scanner 104. The positioning of the reticle backside inspection module 122 adjacent to the reticle storage 120 promotes the safe and efficient inspection of the backside of the reticle 108.

After identification of debris on the backside of the reticle 108, one possible solution for removing debris is the transfer the reticle 108 to a cleaning station external to the scanner 104. At the external cleaning station debris particles are removed from the backside of the reticle 108. While this solution can effectively clean debris particles from the backside of the reticle 108, the solution also includes some serious drawbacks. For example, transferring the reticle 108 out of the scanner environment 104 is a very expensive and time-consuming process. While the reticle 108 is outside of the scanner environment 104, photolithography processes cannot be performed within the scanner 104 until the reticle 108 has been returned to the scanner 104. Additionally, transferring the reticle 108 outside of the scanner 104 subjects the reticle 108 to significantly increased risk of damaging the reticle 108 due to bumping, dropping, or otherwise jostling the reticle 108 during transport. Furthermore, there is the risk of additional debris particles will land on the backside of the reticle 108 during transport.

Principles of the present disclosure overcome the drawbacks of other solutions by including a reticle cleaning system 124 within the scanner 104. The reticle cleaning system 124 is positioned adjacent to the reticle storage 120 within the scanner 104. The reticle cleaning system 124 is configured to effectively and efficiently clean debris particles from the backside of the reticle 108 without transferring the reticle 108 outside of the scanner 104. The reticle cleaning system 124 may also be termed a reticle cleaning module because, in some embodiments, the reticle cleaning system 124 is a modular component that can be coupled to the reticle storage 120.

Prior to a photolithography process, the reticle 108 is transferred to the reticle backside inspection module 122. If the reticle backside inspection module 122 rejects the reticle, then the reticle 108 is quickly transported to the reticle cleaning system 124 nearby within the scanner 104. The reticle cleaning system 124 cleans the backside of the reticle 108. The reticle 108 is then transported back to the reticle backside inspection module 122. If the reticle backside inspection module 122 indicates that there is no debris on the backside of the reticle 108, then the reticle 108 is loaded onto the chuck 118 for EUV photolithography processes.

In some embodiments, the reticle cleaning system 124 performs an analysis process on the backside of the reticle 108. The analysis process identifies the locations of debris particles on the backside of the reticle 108. The analysis process also identifies the height of debris particles on the backside of the reticle 108.

In some embodiments, the reticle cleaning system 124 includes a cleaning member. The cleaning member has a cleaning tip. After the analysis process, the cleaning member is positioned above each debris particle and lowered until the cleaning tip contacts the debris particle. The debris particle adheres to the cleaning tip. The cleaning tip is then raised and the debris particle is removed from the backside of the reticle 108. This process is repeated for each debris particle. Because the analysis process identifies the height of each debris particle, the cleaning member can be carefully lowered so that the cleaning tip is at a height of the debris particle. This ensures that the cleaning tip does not contact the backside of the reticle 108 by lowering the cleaning member too far.

The reticle cleaning system 124 may be a module that attaches or couples to the reticle storage 120. The reticle cleaning system 124 and the reticle storage 120 may include apertures that can be opened to enable transport of the reticle directly from the reticle storage 120 to the reticle cleaning system 124. The reticle backside inspection module 122 may also be directly coupled to the reticle storage 120 in this manner. In this way, the reticle 108 can be quickly and safely passed from the reticle storage 120 to the reticle backside inspection module 122 and back to the reticle cleaning system 124 without exiting the scanner environment 104. This may save a large amount of time and resources.

The scanner 104 may also include a robot arm 126. The robot arm 126 may transfer the reticle 108 between the reticle storage 120, the reticle backside inspection module 122, the reticle cleaning system 124 and the chuck 118. In practice, the scanner 104 may include multiple robot arms 126 for transferring the reticle 108 between various locations within the scanner 104.

FIGS. 2A-2D are illustrations of a reticle cleaning system 124, in accordance with some embodiments. The reticle cleaning system 124 of FIGS. 2A-2D is one example of the reticle cleaning system 124 of FIG. 1. The reticle cleaning system 124 is a module that can be installed within a scanner 104 of an EUV photolithography system 100 to enable cleaning of a reticle 108 without removing the reticle 108 from the scanner 104.

The reticle cleaning system 124 includes a chamber defined by one or more walls 132. The reticle cleaning system 124 includes an interior volume 130. During operation, the interior volume 130 is kept in vacuum condition to prevent contamination of the reticle 108 when the reticle 108 is positioned within the interior volume 130.

In the view of FIGS. 2A-2D, the reticle 108 is positioned on a baseplate 140 within the interior volume 130. The baseplate 140 can correspond to the baseplate of an EUV pod. The reticle has a backside 134 and the exposure side 136. The exposure side 136 of the reticle 108 rests on support pins 142 protruding from the surface of the baseplate 140. The baseplate 140 is one component of the EUV pod.

As described previously, the reticle 108 is positioned within the EUV pod when the reticle 108 is positioned within the reticle storage 120. In some embodiments, whenever the reticle 108 is transported from the reticle storage 120 to the chuck 118, the reticle backside inspection module 122, or the reticle cleaning system 124, the reticle 108 is carried on the baseplate 140 of the EUV pod. Accordingly, the robot arm 126 does not contact the reticle 108 directly during transport. Instead, the robot arm 126 contacts the baseplate 140 on which the reticle 108 is positioned. Further details regarding the baseplate and the EUV pod are provided in relation to FIG. 4.

The reticle cleaning system 124 includes an optical measurement system 127 and a debris removal member 129. The optical measurement system 127 is configured to identify the position of debris particles on the backside 134 of the reticle 108. The optical measurement system 127 is also configured to measure the height of debris particles on the backside 134 of the reticle 108.

In some embodiments, the optical measurement system 127 records the position coordinates of each debris particle on the backside 134 of the reticle 108. The position coordinates can include lateral coordinates. In one example, the horizontal plane of the backside 134 of the reticle 108 is defined by an X direction and a Y direction. X and Y are orthogonal lateral directions. The vertical direction is the Z direction. The Z direction is perpendicular to both the X direction and the Y direction. When the optical measurement system 127 identifies the debris particles on the backside 134 of the reticle 108, the optical measurement records the positions of the debris particles in X and Y coordinates. Other types of coordinates can be utilized to record the position of debris particles on the backside 134 of the reticle 108 without departing from the scope of the present disclosure.

The optical measurement system 127 also measures the height of each debris particle. The height of a debris particle is the distance in the vertical or Z direction that the particle extends above the backside 134 of the reticle 108. When the optical measurement system 127 identifies the X-Y coordinates of a debris particle, the optical measurement system 127 also records the Z component or height of the debris particle. Accordingly, each debris particle may be assigned an X, Y, and Z position by the optical measurement system, in which the Z position corresponds to the height of the debris particle.

The reticle cleaning system 124 includes one or more light sources 128. The light sources 128 can irradiate the backside 134 of the reticle 108 with light. The optical measurement system 127 then detects light scattered from the debris particles. The light that is scattered from the debris particles can be utilized to determine the position and height of each debris particle. The optical measurement system 127 may include light sensors and magnification lenses for magnifying and detecting the light that scatters from the debris particles.

In some embodiments, the light source 128 shine light onto the backside 134 of the reticle 108 via windows in the walls 132 of the chamber. The light source can shine light through windows in sidewalls of the chamber. The light reflects off of the debris particles and is received by light sensors of the optical measurement system. The light source 128 can include lasers that direct light onto the backside 134 at a series of particular angles. Depending on the position of debris particles, the laser light will only impact the debris particles at particular angles. The light sensors of the optical measurement system 127 will only receive light scattered from debris particles when the light source 128 outputs light at those particular angles. Thus, the position of debris particles can be determined based on the angles at which laser light is scattered by the debris particles. The height of debris particles can also be obtained in this manner. Other systems and configurations of light sources and light sensors and lenses can be utilized without departing from the scope of the present disclosure. Furthermore, measurement systems other than optical measurement systems can be utilized to determine the position heights of debris particles without departing from the scope of the present disclosure.

In some embodiments, the reticle cleaning system 124 can have a height between 0.75 m and 1.25 m. The height can correspond to a dimension of the optical measurement system 127 in the Z direction. The reticle cleaning system 124 can have a width between 0.5 m and 1.1 m. The width can correspond to a dimension of the reticle cleaning system 124 in the X direction. The reticle cleaning system 124 can have a depth between 0.5 m and 1.1 m. The depth can correspond to a dimension of the reticle cleaning system 124 in a Y direction. The Y direction can correspond to a direction extending into or out of the drawing sheet. The reticle cleaning system 124 can have other heights, widths, and thicknesses without departing from the scope of the present disclosure.

Figure 2A:
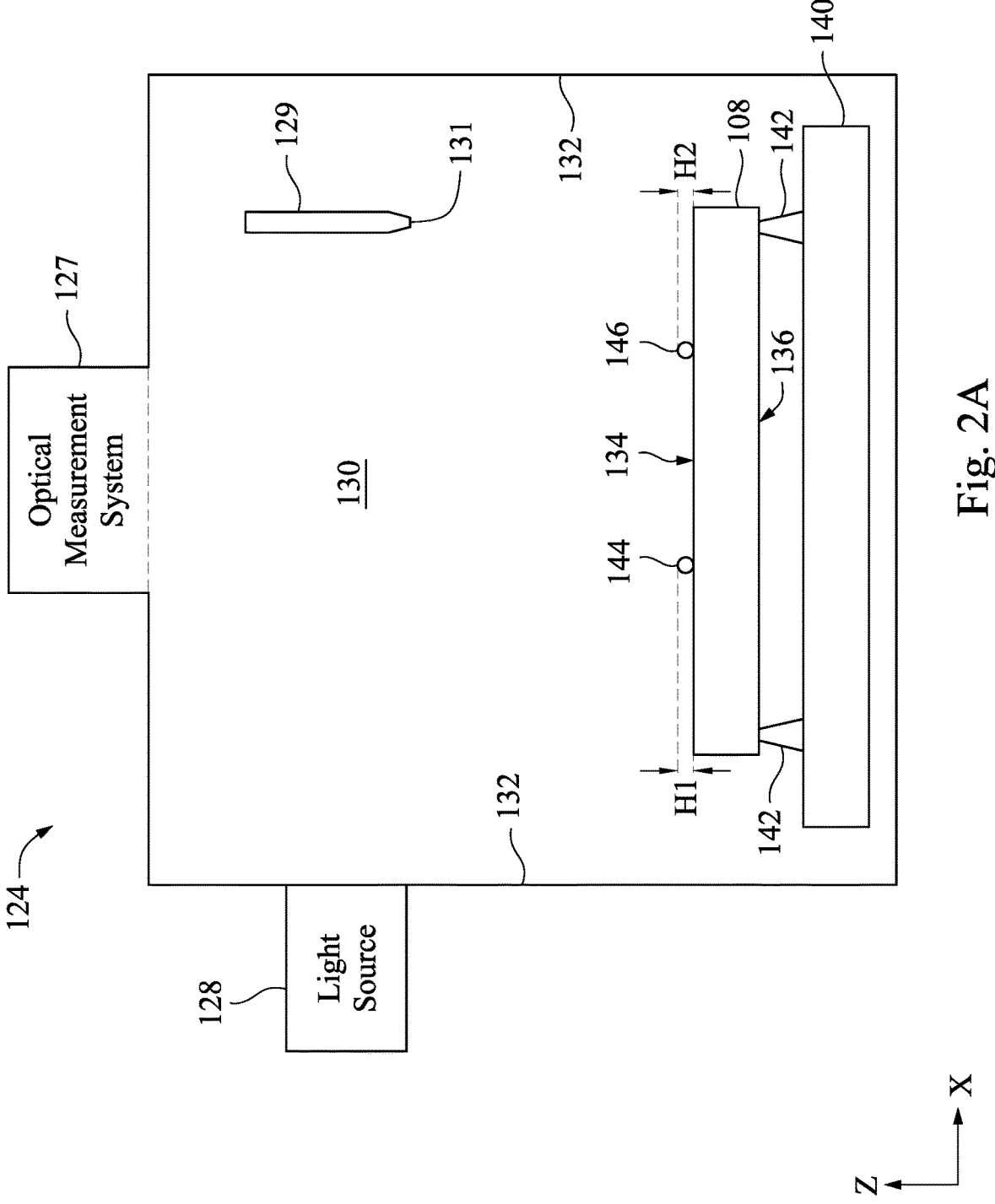
FIGS. 2A-2D are illustrations of a reticle cleaning system, in accordance with some embodiments.

In FIG. 2A, a first debris particle 144 is positioned on the backside 134 of the reticle 108. A second debris particle 146 is also positioned on the backside 134 of the reticle 108. The optical measurement system 127 has detected that the first debris particle 144 has a height H1. The optical measurement system 127 has detected that the second debris particle 146 has a height H2.

The reticle cleaning system 124 includes a cleaning member 129. The cleaning member 129 includes a cleaning tip 131. In the illustration of FIG. 2A, the cleaning member 129 is a general shape of a rod. However, the cleaning member 129 can have other shapes without departing from the scope of the present disclosure.

The cleaning tip 131 can include an adhesive material. The adhesive material is selected to adhere to debris particles when the cleaning tip 131 is brought into contact with the debris particles. The adhesive can include tape, glue, or other substances that can adhere to debris particles. In some embodiments, the cleaning tip 131 includes a replaceable tip. The data can be replaced after a certain number of debris particles have adhere to the cleaning tip 131. In some embodiments, the cleaning tip 131 includes an electrode that can attract and hold debris particles via electrostatic force.

Though not shown in FIG. 2A, the reticle cleaning system 124 can include mechanisms for maneuvering the cleaning member 129. These mechanisms can move the cleaning member in the X and Y directions to the X and Y coordinates of debris particles. The movement mechanisms can move the cleaning member downward in the Z direction so that the cleaning tip 131 is at the height of a cleaning particle.

Figure 2B:
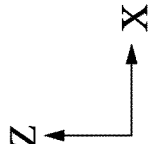

In FIG. 2B the cleaning member 129 has been maneuvered to the X-Y position of the debris particle 144 as recorded by the optical measurement system 127. The cleaning member 129 has been lowered so that the cleaning tip 131 is at the height H1 of the debris particle 144. The cleaning tip 131 contacts the debris particle 144. The debris particle 144 adheres to the cleaning tip 131. Though not shown in FIG. 2B, the cleaning member 129 is then moved upward, carrying the debris particle 144 off of the backside 134 of the reticle 108.

Because the optical measurement system 127 has measured the height of the debris particle 144, the cleaning tip 131 can be brought into contact with the debris particle 144 without contacting or flying on the pressure to the backside 134 of the reticle 108.

Figure 2C:
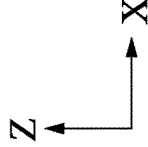

In FIG. 2C the cleaning member 129 has been maneuvered to the X-Y position of the debris particle 146 as recorded by the optical measurement system 127. The cleaning member 129 has been lowered so that the cleaning tip 131 is at the height H2 of the debris particle 146. The cleaning tip 131 contacts the debris particle 146. The debris particle 146 adheres to the cleaning tip 131. Though not shown in FIG. 2B, the cleaning member 129 is then moved upward, carrying the debris particle 146 off of the backside 134 of the reticle 108. Because the optical measurement system 127 has measured the height of the debris particle 146, the cleaning tip can be brought into contact with the debris particle 146 without contacting or flying on the pressure to the backside 134 of the reticle 108.

Figure 2D:
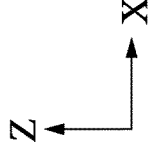

In FIG. 2D, all the debris particles have been removed from the backside 134 of the reticle 108. The optical measurement system 127 can perform a final check to ensure that there are no remaining debris particles on the backside 134 of the reticle 108. The robot arm 126 can then transfer the baseplate 140 with the reticle 108 to the reticle backside inspection module 122. The reticle backside inspection module 122 can inspect the backside 134 of the reticle 108 to ensure that there are the debris particles on the backside 134 of the reticle 108. The reticle 108 can then be loaded into the chuck 118 within the scanner 104.

The reticle cleaning system 124 can have cleaning mechanisms other than the cleaning member 129. For example, the reticle cleaning system 124 may flow one or more fluids onto the backside 134 of the reticle 108. The fluids can help remove debris particles. In some cases, the fluid may be utilized that chemically reacts with debris particles to dissolve them. In some cases, the fluid may include inert gases that are flowed into the vacuum chamber of the reticle cleaning system 124 in order to carry away debris particles via one or more exhaust channels. Various types of gas or liquid cleaning fluids can be utilized to remove debris particles from the backside 134 of the reticle 108. Various other types of cleaning mechanisms can be utilized for the reticle cleaning system 124 without departing from the scope of the present disclosure.

Figure 3:
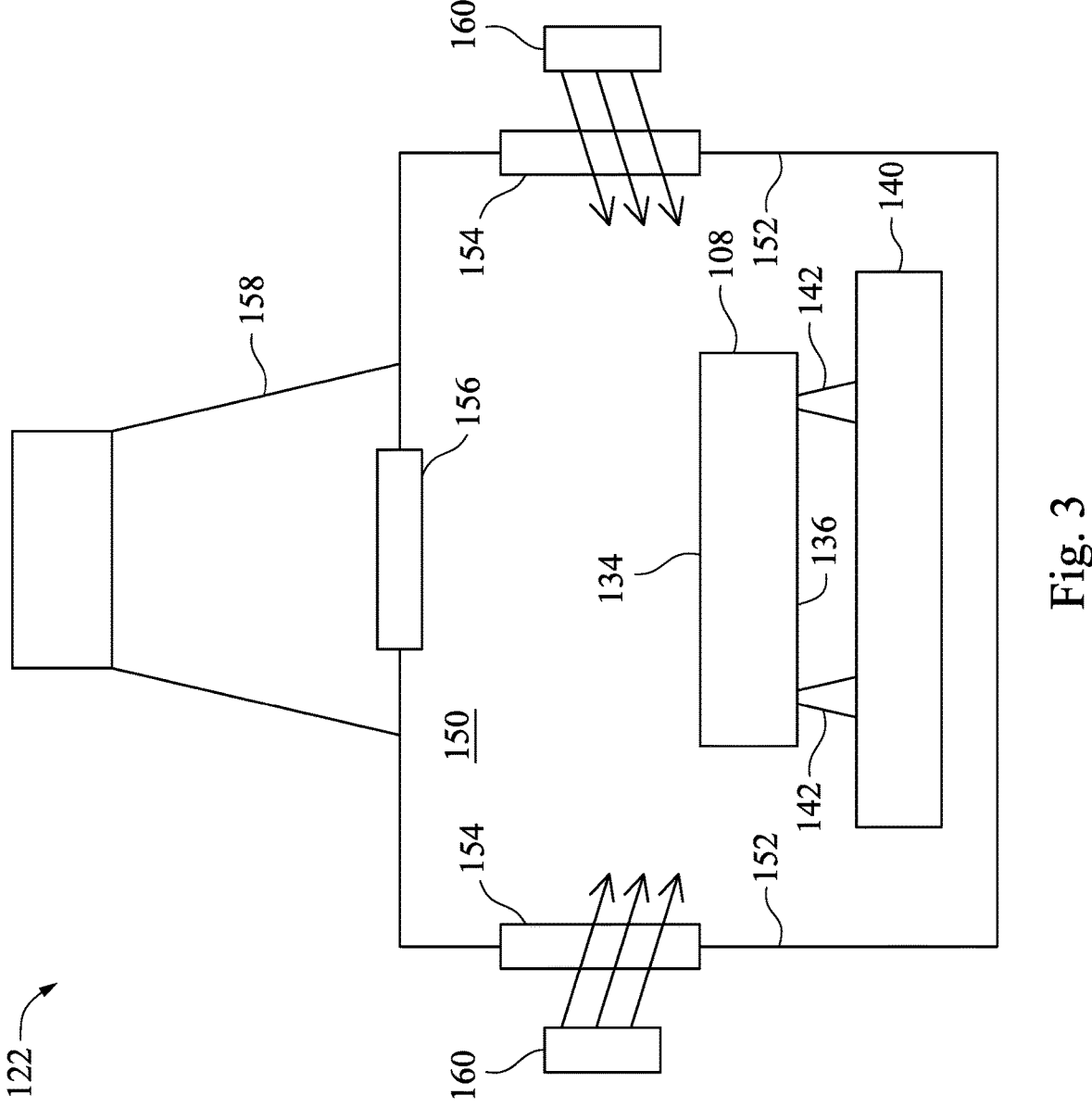
FIG. 3 is an illustration of a reticle backside inspection module, in accordance with some embodiments.

FIG. 3 is an illustration of a reticle backside inspection module 122, in accordance with some embodiments. The reticle backside inspection module 122 of FIG. 3 is one example of the reticle backside inspection module 122 of FIG. 1.

The reticle backside inspection module 122 includes a chamber defined by one or more walls 152. The reticle backside inspection module 122 includes an interior volume 150. During operation, the interior volume 150 is kept in vacuum condition to prevent contamination of the reticle 108 when the reticle 108 is positioned within the interior volume 150.

In the view of FIGS. 2A-2D, the reticle 108 is positioned on a baseplate 140 within the interior volume 150. The baseplate 140 can correspond to the baseplate of an EUV pod. The reticle has a backside 134 and the exposure side 136. The exposure side 136 of the reticle 108 rests on support pins 142 protruding from the surface of the baseplate 140. The baseplate 140 is one component of the EUV pod.

As described previously, the reticle 108 is positioned within the EUV pod when the reticle is positioned within the reticle storage 120. In some embodiments, whenever the reticle is transported from the reticle storage 120 to the chuck 118, the reticle backside inspection module 122, or the reticle cleaning system 124, the reticle 108 is carried on the baseplate 140 of the EUV pod. Accordingly, the robot arm 126 does not contact the reticle 108 directly during transport. Instead, the robot arm 126 contacts the baseplate 140 on which the reticle 108 is positioned. Further details regarding the baseplate and the EUV pod are provided in relation to FIG. 4.

The reticle backside inspection module 122 includes an optical measurement system 158. The optical measurement system 158 is configured to identify the position of debris particles on the backside 134 of the reticle 108. The optical measurement system 158 is also configured to measure the height of debris particles on the backside 134 of the reticle 108.

In some embodiments, the optical measurement system 158 records the position coordinates of each debris particle on the backside 134 of the reticle 108. The position coordinates can include lateral coordinates. In one example, the horizontal plane of the backside 134 of the reticle 108 is defined by an X direction and a Y direction. X and Y are orthogonal lateral directions. The vertical direction is the Z direction. The Z direction is perpendicular to both the X direction and the Y direction. When the optical measurement system 158 identifies the debris particles on the backside 134 of the reticle 108, the optical measurement records the positions of the debris particles in the X and Y coordinates. Other types of coordinates can be utilized to record the position of debris particles on the backside 134 of the reticle 108 without departing from the scope of the present disclosure.

The optical measurement system 158 also measures the height of each debris particle. The height of a debris particle is the distance in the vertical or Z direction that the particle extends above the backside 134 of the reticle 108. When the optical measurement system 158 identifies the X-Y coordinates of a debris particle, the optical measurement system 127 also records the Z component or height of the debris particle. Accordingly, each debris particle may be assigned an X, Y, and Z position by the optical measurement system, in which the Z position corresponds to the height of the debris particle.

In some embodiments, the optical measurement system 158 of the reticle backside inspection module 122 rejects the reticle 108 if one or more debris particles have a height greater than a threshold height. Accordingly, the reticle backside inspection module 122 may tolerate the presence of some debris particles on the backside 134 of the reticle 108 if none of the debris particles has a height greater than a threshold height. If the reticle backside inspection module 122 rejects the reticle 108, the robot arm 126 transfers the baseplate 140 carrying the reticle 108 to the reticle cleaning system 124.

The reticle backside inspection module 122 includes lateral windows 154 in the walls 152. The reticle backside inspection module 122 also includes an upper window 156. The reticle backside inspection module 122 includes illuminators 160. The illuminators 160 irradiate the backside 134 of the reticle 108 with light via the windows 154. The illuminators 160 can include lasers, LEDs, or other suitable sources of light. If the light impacts a debris particle on the backside 134, the light will scatter rather than reflect smoothly off of the backside 134 of the reticle 108. Some of the scattered light will pass through the upper window 156 into the optical measurement system 158. In this way, the optical measurement system 158 cooperates with the illuminators 160 to detect the position of the height of debris particles on the backside 134 of the reticle 108. The reticle cleaning system 124 may include the same types of illuminators and windows as shown in the reticle backside inspection module 122.

The optical measurement system 158 may include one or more lenses, mirrors, filters, and image capture devices. These components can focus reflect, filter, and detect light scattered from debris particles. The image capture devices can include charge coupled devices photodiodes, or other types of image capture devices.

In some embodiments, the reticle cleaning system 124 does not measure the position in height of debris particles. Instead, the reticle backside inspection module 122 records the X, Y, and Z coordinates of debris particles as described previously and passes them to the reticle cleaning system 124. The reticle cleaning system 124 then uses these coordinates to maneuver the cleaning member 129 to remove debris particles from the backside 134 of the reticle 108.

Figure 4:
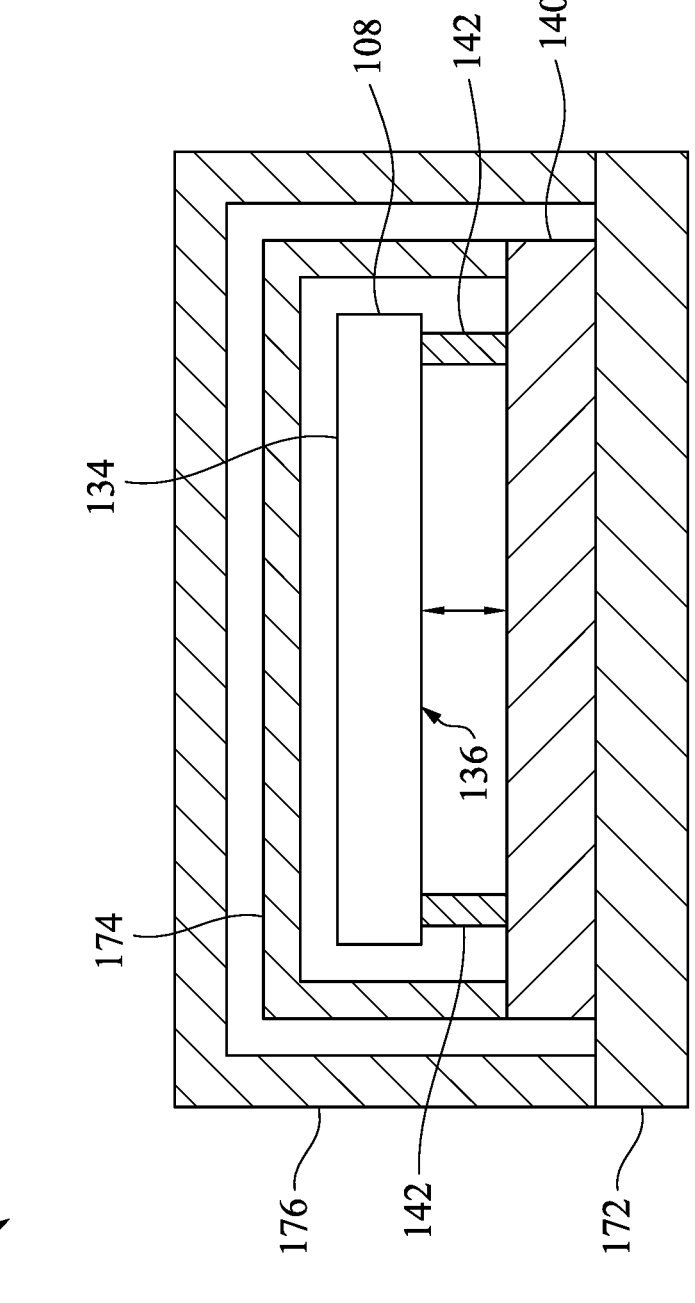
FIG. 4 is an illustration of an EUV pod, in accordance with some embodiments.

FIG. 4 is an illustration of an assembled EUV pod 170, according to some embodiments. After the reticle 108 is positioned on the baseplate 140 as shown in FIG. 2D, the robot arm 126 (not shown), or multiple robotic devices, places a cover plate 174 over the reticle 108. The cover plate 174 rests on the baseplate 140. The cover plate 174 and the baseplate 140 collectively enclose the reticle 108. The robot arm 126, or multiple robotic devices, place the baseplate 140 on a bottom shell 172. The top shell 176 is then placed on the bottom shell 172. The top shell 176 and the bottom shell 172 collectively enclose the baseplate 140 and the cover plate 174. The EUV pod 170 includes the bottom shell 172, the top shell 176, the cover plate 174, and the baseplate 140.

The reticle 108 displaced in the assembled EUV pod 170 is in the reticle storage 120. When the reticle 108 is to be sent to the reticle backside inspection module 122, the chuck 118, or the reticle cleaning system 124, the EUV pod 170 is disassembled and the reticle 108 is carried on the baseplate 140 to the particular destination. An EUV pod 170 can have other configurations without departing from the scope of the present disclosure.

Figure 5:
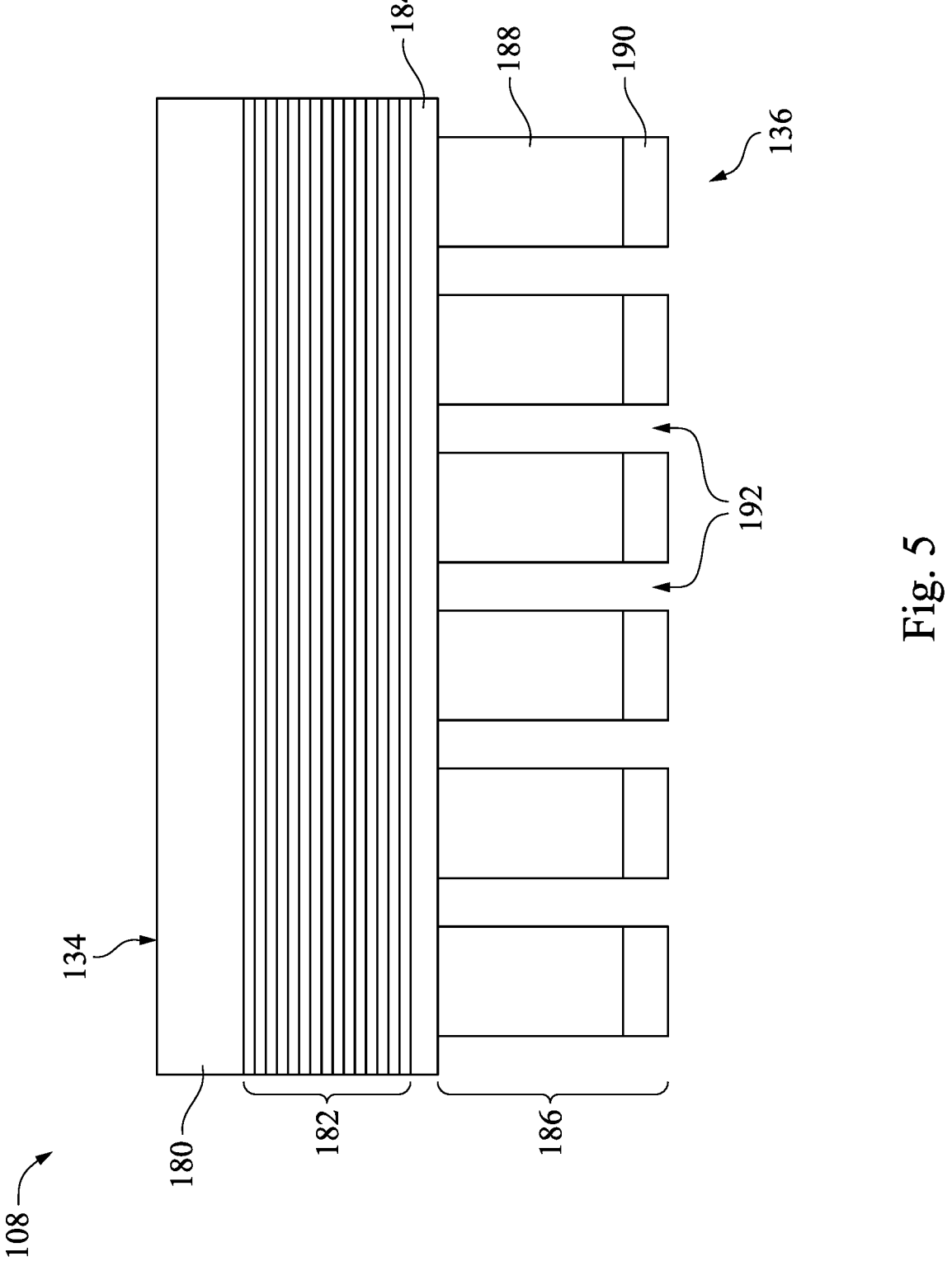
FIG. 5 is an illustration of an EUV reticle, in accordance with some embodiments.

FIG. 5 is an illustration of a reticle 108, according to some embodiments. The reticle 108 is one example of a reticle in accordance with FIGS. 1-4. The reticle 108 includes a substrate 180, a reflective multilayer 182 positioned on the substrate 180, a buffer layer 184 positioned on the reflective multilayer 182, and an absorption layer 186 positioned on the buffer layer 184. The substrate 180 includes a backside 134. The backside 134 can be considered the surface of the reticle 108 that is opposite the exposure side 136. The fabrication process of the reticle 108 eventually results in the reticle 108 having a selected pattern in the absorption layer 186. In the example of FIG. 5, the pattern is indicated by the trenches 192 in the absorption layer 186. The exposure side 136 can correspond to the exposed surface of the absorption layer 186, the exposed surface of the buffer layer 184, or the combination of the top surface of the exposed surface of the absorption layer 186 and the exposed surface of the buffer layer 184. The reticle 108 can include other structures and arrangements without departing from the scope of the present disclosure The substrate 180 includes a low thermal expansion material. The low thermal expansion material substrate 180 serves to minimize image distortion due to heating of the reticle 108. The low thermal expansion material substrate 180 can include materials with a low defect level and a smooth surface.

In some embodiments, the substrate 180 can include $SiO_2$. The substrate 180 can be doped with titanium dioxide. The substrate 180 can include other low thermal expansion materials than those described above without departing from the scope of the present disclosure.

Though not shown herein, in some embodiments the substrate 180 may be positioned on a conductive layer. The conductive layer can assist in electrostatically chucking the reticle 108 during fabrication and use of the reticle 108. In some embodiments, the conductive layer includes chromium nitride. The conductive layer can include other materials without departing from the scope of the present disclosure.

The reticle 108 includes the reflective multilayer 182. The reflective multilayer 182 is positioned on the substrate 180. The reflective multilayer 182 is configured to reflect the extreme ultraviolet light during photolithography processes in which the reticle 108 is used. The reflective properties of the reflective multilayer 182 are described in more detail below.

In some embodiments, the reflective multilayer 182 operates in accordance with reflective properties of the interface between two materials. In particular, reflection of light will occur when light is incident at the interface between two materials of different refractive indices. A greater portion of the light is reflected when the difference in refractive indices is larger.

The reflective multilayer 182 includes a plurality of pairs of layers. Each pair of layers includes a layer of a first material and a layer of a second material. The materials and thicknesses of the layers are selected to promote reflection and constructive interference of extreme ultraviolet light. In some embodiments, each pair of layers includes a layer of molybdenum and a layer of silicon. In one example, the layer of molybdenum is between 2 nm and 4 nm in thickness. In one example, the layer of silicon is between 3 nm and 5 nm in thickness. The thicknesses of the layers in the reflective multilayer 182 are selected based on the expected wavelength of extreme ultraviolet light used in the photolithography processes and the expected angle of incidence of the extreme ultraviolet light during the photolithography processes. The number of pairs of layers is between 20 pairs of layers and 60 pairs of layers, according to some embodiments. Other materials, thicknesses, numbers of pairs, and configurations of layers in the reflective multilayer 182 can be utilized without departing from the scope of the present disclosure. Other wavelengths of extreme ultraviolet light can be used without departing from the scope of the present disclosure.

In some embodiments, the buffer layer 184 is positioned on the reflective multilayer 182. One purpose of the buffer layer 184 is to protect the reflective multilayer during etching processes of the absorption layer 186. Accordingly, the buffer layer 184 includes materials that are resistant to etching by etching processes that etch the absorption layer 186. The etching processes and the materials of the absorption layer will be described in more detail below.

In some embodiments, the buffer layer 184 includes ruthenium. The buffer layer 184 can include compounds of ruthenium including ruthenium boride and ruthenium silicide. The buffer layer can include chromium, chromium oxide, or chromium nitride. The buffer layer 184 can be deposited by a low temperature deposition process to prevent diffusion of the buffer layer 184 into the reflective multilayer 182. In some embodiments, the buffer layer 184 has a thickness between 2 nm and 4 nm. Other materials, deposition processes, and thicknesses can be utilized for the buffer layer 184 without departing from the scope of the present disclosure.

The absorption layer 186 is positioned on the buffer layer 184. The material of the absorption layer 186 is selected to have a high absorption coefficient for wavelengths of extreme ultraviolet light that will be used in the photolithography processes with the reticle 108. In other words, the materials of the absorption layer 186 are selected to absorb extreme ultraviolet light.

In some embodiments, the absorption layer 186 is between 40 nm and 100 nm in thickness. In some embodiments, the absorption layer 186 includes material selected from a group including chromium, chromium oxide, titanium nitride, tantalum nitride, tantalum, titanium, aluminum-copper, palladium, tantalum boron nitride, tantalum boron oxide, aluminum oxide, molybdenum, or other suitable materials. Other materials and thicknesses can be used for the absorption layer 186 without departing from the scope of the present disclosure.

In some embodiments, the absorption layer 186 includes a first absorption layer 188 and a second absorption layer 190. The first absorption layer 188 is positioned on the buffer layer 184. The second absorption layer 190 is positioned on the first absorption layer 188.

In some embodiments, the first absorption layer 188 includes tantalum boron nitride. The second absorption layer 190 includes tantalum boron oxide. The thickness of the first absorption layer 188 is between 30 nm and 80 nm. The thickness of the second absorption layer 190 is between 1 nm and 40 nm. The absorption layer 186 can include different materials, thicknesses, and numbers of layers than those described above without departing from the scope of the present disclosure. In some embodiments, the absorption layer 186 includes only a single absorption layer. Accordingly, the absorption layer 186 can be an absorption layer.

The layers of the reticle 108 shown in FIG. 5 may be formed by various thin-film deposition processes. The thin-film deposition processes can include physical vapor deposition process such as evaporation and DC magnetron sputtering, a plating process such as electroless plating or electroplating, a chemical vapor deposition process such as atmospheric pressure chemical vapor deposition, low pressure chemical vapor deposition, plasma enhanced chemical vapor deposition, high density plasma chemical vapor deposition, ion beam deposition, spin-on coating, metal-organic decomposition, and/or other methods known in the art.

Figure 6:
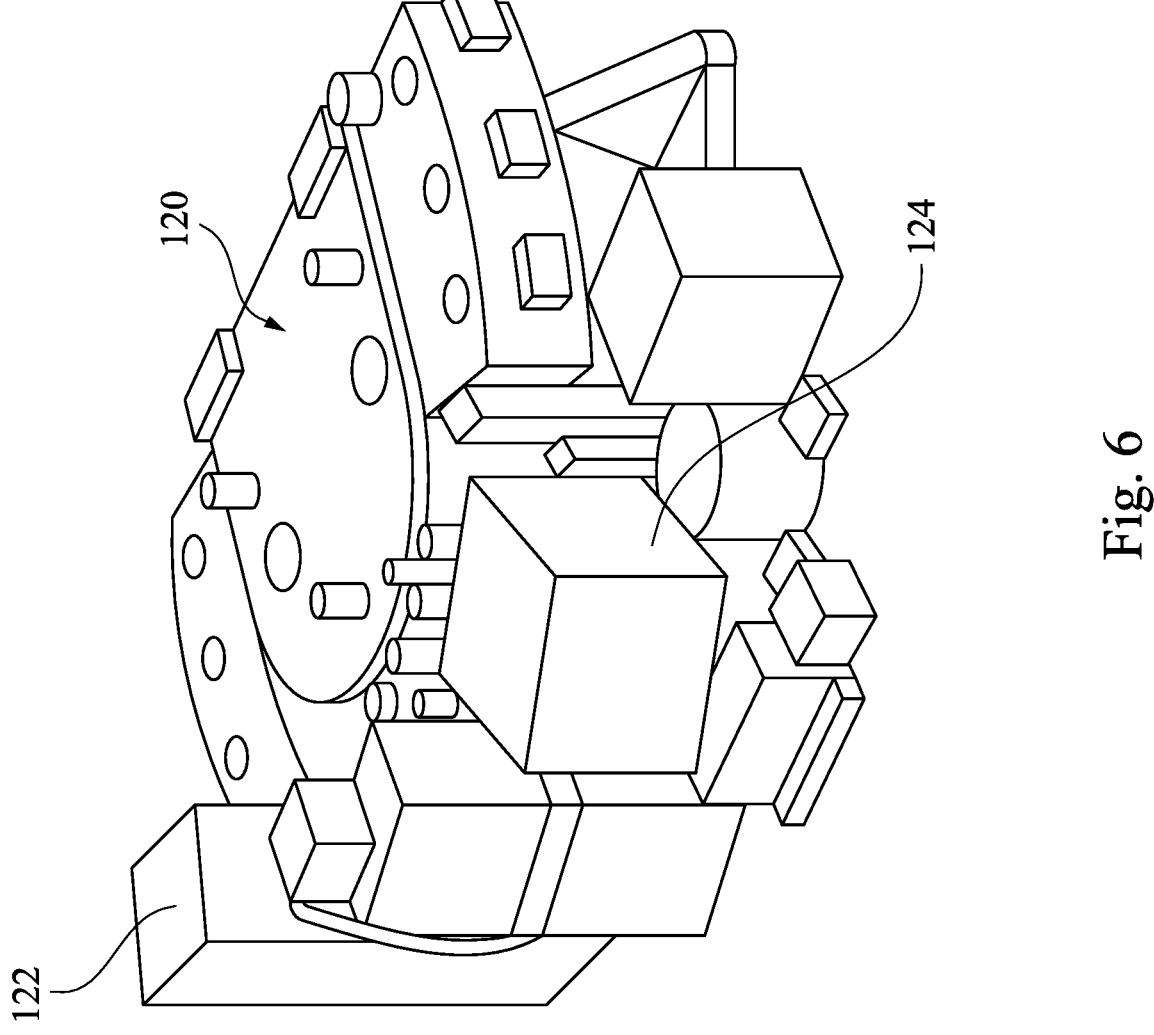
FIG. 6 is an illustration of a reticle storage, a reticle backside inspection module, and a reticle cleaning system in accordance with some embodiments.

FIG. 6 is an illustration of a reticle storage 120, a reticle backside inspection module 122, and a reticle cleaning system 124, in accordance with some embodiments. The reticle storage 120 is a reticle handling chamber in which the reticle 108 is stored when it is not in use. As set forth previously, the reticle 108 may be placed in an EUV pod 170 within the reticle storage 120. The reticle storage 120 is typically in a vacuum state to reduce the chance that debris particles may contaminate the reticle 108. The reticle storage 120 is positioned within the scanner 104.

The reticle backside inspection module 122 is coupled to the reticle storage 120. The reticle backside inspection module 122 is also kept in a vacuum state to reduce the chance that debris particles may contaminate the reticle 108. Prior to transferring the reticle 108 from the reticle storage 120 to the chuck 118, the reticle 108 is transferred from the reticle storage 120 to the reticle backside inspection module 122. Because the reticle backside inspection module 122 is directly coupled to the reticle storage 120 within the scanner 104, the reticle 108 can be quickly and safely transferred from the reticle storage 120 to the reticle backside inspection module 122.

The reticle cleaning system 124 is directly coupled to the reticle storage 120. The reticle cleaning system 124 is also kept in a vacuum state to reduce the chance that debris particles may contaminate the reticle 108. If the reticle 108 is rejected by the reticle backside inspection module 122, then the reticle 108 can be transferred from the reticle backside inspection module 122 into the reticle storage 120 and finally to the reticle cleaning system 124. Because the reticle cleaning system 124 is directly coupled to the reticle storage 120 within the scanner 104, the reticle 108 can be quickly and safely transferred from the reticle backside inspection module 122 to the reticle cleaning system 124 with minimal risk of contamination and with minimal time. This saves an enormous amount of time and resources compared to a situation in which the reticle 108 is transferred out of the scanner 104 cleaning.

FIG. 7 is a flow diagram of a method 700 for operating an EUV photolithography system, in accordance with some embodiments. The method 700 can utilize systems, components, and processes described in relation to FIGS. 1-6. At 702, the method includes storing a reticle in a reticle storage within a scanner of an EUV photolithography system. One example of a reticle is the reticle 108 of FIG. 1. One example of a reticle storage is the reticle storage 120 of FIG. 1. One example of a scanner is the scanner 104 of FIG. 1. One example of an EUV photolithography system is the EUV photolithography system of FIG. 1. At 704, the method 700 includes transferring the reticle from the reticle storage to a backside inspection module within the scanner. One example of a backside inspection module is the reticle backside inspection module 122 of FIG. 1. At 706, the method 700 includes inspecting a backside of the reticle with the reticle backside inspection module. One example of a backside of a reticle is the reticle backside 134 of FIG. 5. At 708, the method 700 includes transferring the reticle from the reticle backside inspection module into a vacuum chamber of a reticle cleaning system within the scanner. One example of a reticle cleaning system is the reticle cleaning system 124 of FIG. 1. At 710, the method 700 includes cleaning the reticle within the vacuum chamber of the reticle cleaning system.

FIG. 8 is a flow diagram of a method 800 for operating an extreme ultraviolet photolithography system, in accordance with some embodiments. The method 800 can utilize systems, components, and processes described in relation to FIGS. 1-7. At 802, the method 800 includes performing an extreme ultraviolet photolithography process by directing extreme ultraviolet light onto a reticle within the extreme ultraviolet scanner. One example of a reticle is the reticle 108 of FIG. 1. One example of a scanner is the scanner 104 of FIG. 1. At 804, the method 800 includes storing the reticle in a reticle storage within the scanner after performing the extreme ultraviolet photolithography process. One example of a reticle storage is the reticle storage 120 of FIG. 1. At 806, the method 800 includes inspecting a backside of the reticle with a reticle backside inspection module within the scanner after storing the reticle in the reticle storage. One example of a reticle backside inspection module is reticle backside inspection module 122 of FIG. 1. One example of a backside of a reticle is the reticle backside 134 of FIG. 5. At 808, the method 800 includes cleaning the backside of the reticle with a reticle cleaning system within the scanner after inspecting the backside of the reticle. One example of a reticle cleaning system is the reticle cleaning system 124 of FIG. 1.

Embodiments of the present disclosure effectively and efficiently remove particles and other contaminants from an EUV reticle. Prior to a photolithography process, the reticle is inspected by a backside inspection module. If the backside inspection module detects debris particles on the reticle, then reticle is transferred to a reticle cleaning system positioned within the scanner. The reticle cleaning system cleans or removes the particles from the reticle. The reticle is then transferred back to the backside inspection module. If the backside inspection module determines that there are no debris particles, then the reticle is loaded into the chuck for an EUV photolithography process.

Embodiments of the present disclosure provide many benefits to EUV photolithography systems. Because the reticle cleaning system is advantageously positioned within the scanner, the reticle does not need to be removed from the scanner environment in order to clean the reticle. Removing the reticle from the scanner to clean the reticle is a very expensive and time-consuming process. The reticle cannot be used for EUV processes for a very long time. Accordingly, the reticle cleaning system positioned within the scanner environment saves enormous amounts of time and resources. When the reticle is rejected by the inspection module, the reticle is quickly cleaned within the scanner environment by the reticle cleaning system. The result is that cleaning processes are performed quickly and the EUV reticle is available for EUV photolithography processes in a very short amount of time. Furthermore the cleaning process is very effective, so EUV photolithography processes will not be disrupted or corrupted by the presence of debris on the reticle.

In some embodiments, a system includes an EUV scanner and a chuck in the scanner and configured to hold a reticle during an EUV photolithography process. The system includes a reticle storage within the scanner and configured to store the reticle and a reticle cleaning system within the scanner and coupled to the reticle storage.

In some embodiments, a system includes a scanner configured to receive EUV light, to direct the EUV light onto a reticle within the scanner, and to direct the EUV light from the reticle to a wafer. The system includes a reticle storage within the scanner configured to store the reticle, a reticle backside inspection module within the scanner configured to inspect a backside of the reticle, a reticle cleaning system within the scanner and configured to clean the backside of the reticle, and a robot arm configured to transfer the reticle between the reticle backside inspection module and the reticle cleaning system.

In some embodiments, a method includes storing a reticle in a reticle storage within a scanner of an EUV photolithography system, transferring the reticle from the reticle storage to a backside inspection module within the scanner, and inspecting a backside of the reticle with the reticle backside inspection module. The method includes transferring the reticle from the reticle backside inspection module into a vacuum chamber of a reticle cleaning system within the scanner and cleaning the reticle within the vacuum chamber of the reticle cleaning system.

In some embodiments, a method includes performing an extreme ultraviolet photolithography process by directing extreme ultraviolet light onto a reticle within an extreme ultraviolet scanner and storing the reticle in a reticle storage within the scanner after performing the extreme ultraviolet photolithography process. The method includes inspecting a backside of the reticle with a reticle backside inspection module within the scanner after storing the reticle in the reticle storage and cleaning the backside of the reticle with a reticle cleaning system within the scanner after inspecting the backside of the reticle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
an extreme ultraviolet scanner;
a chuck in the scanner and configured to hold a reticle during an extreme ultraviolet photolithography process, the reticle comprising an exposure side and a backside opposite the exposure side, the chuck configured to hold the backside of the reticle using electrostatic force or clamps;
a reticle storage within a vacuum enclosure of the scanner and configured to store the reticle while the reticle is enclosed within an EUV pod, the EUV pod comprising a baseplate and cover plate, wherein the reticle rests on support pins extending from the baseplate, and the baseplate remains under the reticle during transfer; and
a reticle backside inspection module within the vacuum enclosure of the scanner and directly coupled to the reticle storage, the reticle backside inspection module comprising:
an optical measurement system configured to identify positions of debris particles on the backside of the reticle using X, Y, and Z coordinates, where the Z coordinate corresponds to a height of a debris particle above the backside;
a plurality of illuminators configured to irradiate the backside of the reticle via one or more lateral windows and to scatter light off debris particles; and
an image capture device of the optical measurement system configured to receive scattered light via a window and determine whether any debris particle exceeds a threshold height;
a reticle cleaning system within the vacuum enclosure of the scanner and directly coupled to the reticle storage, the reticle cleaning system comprising:
a light source configured to irradiate the backside of the reticle to facilitate particle detection;
an optical measurement system configured to measure a height of each debris particle from the backside of the reticle using scattered light;

a cleaning member having a cleaning tip formed from an adhesive material or an electrostatic electrode and configured to be maneuvered in X, Y, and Z directions to contact a debris particle at its measured height;
wherein the cleaning tip is prevented from contacting the reticle by limiting movement based on a measured Z height; and
wherein the cleaning member is configured to remove the debris particle by adhering the debris particle to the cleaning tip; and
a robot arm positioned within the scanner and configured to transfer the reticle between the reticle storage, the reticle backside inspection module, and the reticle cleaning system,
wherein the robot arm transports the reticle without directly contacting the reticle by grasping the baseplate of the EUV pod on which the reticle rests,
and wherein the robot arm is configured to transfer the reticle in a sequence comprising:
transfer from the reticle storage to the backside inspection module;
upon rejection, transfer from the backside inspection module to the reticle cleaning system; and
after cleaning, return transfer to the backside inspection module for verification prior to delivery to the chuck.

2. The system of claim 1, wherein the reticle cleaning system and the reticle backside inspection module are positioned adjacent to opposite sides of the reticle storage.

3. The system of claim 1, wherein the cleaning tip is replaceable after a predetermined number of debris particles have adhered to it.

4. The system of claim 3, wherein the cleaning tip includes an adhesive material comprising tape or glue.

5. The system of claim 1, wherein the light source of the reticle cleaning system includes a laser configured to irradiate the backside of the reticle at a series of specific angles to facilitate height detection of debris particles.

6. The system of claim 1, wherein the reticle cleaning system includes a positioning mechanism configured to maneuver the cleaning member based on the X, Y, and Z coordinates received from the optical measurement system.

7. The system of claim 1, wherein the reticle cleaning system is further configured to perform a final scan of the backside of the reticle using the light source and optical measurement system after cleaning to confirm that all debris particles have been removed.

8. The system of claim 1, wherein the reticle backside inspection module is physically coupled to the reticle storage within the scanner via apertures that allow the reticle to pass directly between the reticle backside inspection module and the reticle storage.

9. The system of claim 8, wherein the reticle backside inspection module is further configured to prevent the reticle from being loaded into the chuck if the backside of the reticle is contaminated.

10. The system of claim 1, wherein the reticle backside inspection module and the reticle cleaning system each comprise a window to allow light entry and exit for optical inspection.

11. A method, comprising:
performing an extreme ultraviolet photolithography process by directing extreme ultraviolet light onto a reticle that is positioned within an extreme ultraviolet scanner;
when performing the extreme ultraviolet photolithography process, holding the reticle in place with a chuck within the extreme ultraviolet scanner such that an exposure side of the reticle is exposed to the extreme ultraviolet light, the chuck holds a backside of the reticle opposite to the exposure side of the reticle utilizing an electrostatic force or clamps;

storing the reticle in a reticle storage within a vacuum enclosure of the scanner after performing the extreme ultraviolet photolithography process, wherein the reticle is enclosed within an EUV pod including a baseplate from which support pins extend outward and a cover plate, and the reticle rests on the support pins when enclosed within the EUV pod;

transferring the reticle from the reticle storage directly into a reticle backside inspection module that is directly coupled to the reticle storage and is within the vacuum enclosure of the scanner by grasping the baseplate of the EUV pod with a robot arm without directly contacting the reticle;

inspecting the backside of the reticle with the reticle backside inspection module within the vacuum enclosure of the scanner after storing the reticle in the reticle storage, inspecting the backside of the reticle with the reticle backside inspection module including:

identifying positions of debris particles on the backside of the reticle using X, Y, and Z coordinates with an optical measurement system of the reticle backside inspection module, where the Z coordinate corresponds to a height of a debris particle above the backside;

irradiating the backside of the reticle with a plurality of illuminators of the reticle backside inspection module via one or more lateral windows to scatter light off debris particles;

receiving scattered light scattered from the backside surface of the reticle via a window directed towards an image capture device of the optical measurement system of the reticle backside inspection module and determining whether any debris particle exceeds a threshold height;

transferring the reticle from the reticle backside inspection module directly into the reticle storage by grasping the baseplate with the robot arm without directly contacting the reticle;

transferring the reticle from the reticle storage by grasping the baseplate with the robot arm without directly contacting the reticle directly into a reticle cleaning system that is directly coupled to the reticle storage and isolated from the reticle backside inspection module, the reticle cleaning system located within the vacuum enclosure of the scanner; and cleaning the backside of the reticle with the reticle cleaning system within the scanner after inspecting the backside of the reticle, cleaning the backside of the reticle with the reticle cleaning system further includes:

irradiating the backside of the reticle with a light source of the reticle cleaning system to facilitate particle detection;

measuring a height of each debris particle from the backside of the reticle using scattered light received by an optical measurement system of the reticle cleaning system; and for each debris particle, moving a cleaning tip of a cleaning member of the reticle cleaning system into contact with the debris particle and adhering the debris particle to the cleaning tip.

12. The method of claim 11, wherein the cleaning tip is replaceable after a determined number of debris particles have adhered to the replaceable cleaning tip, and the replaceable cleaning tip includes an adhesive material configured to adhere to the debris particle, the adhesive material comprising tape or glue.

13. The method of claim 12, wherein transferring the reticle from the reticle backside inspection module to the reticle cleaning system comprises transferring the reticle from the reticle backside inspection module to the reticle cleaning system responsive to the reticle backside inspection module detecting debris particles on the backside of the reticle.

14. The method of claim 11, further comprising:

outputting droplets into an extreme ultraviolet light generation chamber;

generating the extreme ultraviolet light within the extreme ultraviolet light generation chamber by irradiating the droplets with laser light; and directing the extreme ultraviolet light from the ultraviolet light generation chamber into the scanner with a collector.

15. The method of claim 11, wherein the inspecting includes identifying the presence of debris particles on the backside of the reticle by, for each debris particle, determining the location of the debris particle in an X coordinate direction, a Y coordinate direction, and a Z coordinate direction, wherein the X and Y coordinate directions are orthogonal lateral directions, and the Z coordinate direction corresponds to a height of the debris particle; and moving a cleaning tip of the reticle cleaning system into contact with the debris particle uses the X coordinate direction, the Y coordinate direction, and the Z coordinate direction of the debris particle determined by the reticle backside inspection module.

16. A method, comprising:

performing an extreme ultraviolet photolithography process by directing extreme ultraviolet light onto a reticle that is positioned within an extreme ultraviolet scanner and holding the reticle with a chuck within the extreme ultraviolet light scanner, the chuck holds a backside of the reticle utilizing an electrostatic force or clamps;

storing a reticle in a reticle storage within a vacuum enclosure of a scanner of an extreme ultraviolet photolithography system, wherein the reticle is enclosed within an EUV pod including a baseplate from which support pins extend outward and a cover plate, and the reticle rests on the support pins when enclosed within the EUV pod;

transferring the reticle from the reticle storage directly to a chamber of a reticle backside inspection module within the vacuum enclosure of the scanner that is directly coupled to the reticle storage;

inspecting the backside of the reticle with the reticle backside inspection module located within the vacuum enclosure of the scanner, the inspecting including:

identifying the presence of debris particles on the backside of the reticle with an optical measurement system of the reticle backside inspection module by, for each debris particle, determining the location of the debris particle in an X coordinate direction, a Y coordinate direction, and a Z coordinate direction, wherein the X and Y coordinate directions are orthogonal lateral directions, and the Z coordinate direction corresponds to a height of the debris particle;

irradiating the backside of the reticle with a plurality of illuminators of the reticle backside inspection module via one or more lateral windows to scatter light off debris particles;

receiving scattered light scattered from the backside surface of the reticle via a window directed towards an image capture device of the optical measurement system of the reticle backside inspection module and determining whether any debris particle exceeds a threshold height;

transferring the reticle from the chamber of the reticle backside inspection module directly into a vacuum chamber of a reticle cleaning system within the vacuum enclosure of the scanner; and cleaning the backside of the reticle within the vacuum chamber of the reticle cleaning system including:

irradiating the backside of the reticle with a light source of the reticle cleaning system to facilitate particle detection;

measuring a height of each debris particle from the backside of the reticle using scattered light received by an optical measurement system of the reticle cleaning system; and for each debris particle, moving a cleaning tip of a cleaning member of the reticle cleaning system into contact with the debris particle using the X coordinate direction, the Y coordinate direction, and the Z coordinate direction of the debris particle determined by the reticle backside inspection module.

17. The method of claim 16, further comprising:

loading the reticle onto a chuck within the scanner; and performing an extreme ultraviolet photolithography process with the reticle while the reticle is loaded onto the chuck.

18. The method of claim 16, further comprising transferring the reticle from the reticle backside inspection module into the vacuum chamber of the reticle cleaning system responsive to detecting a debris particle on the backside of the reticle with the reticle backside inspection module.

19. The method of claim 16, wherein inspecting the backside of the reticle comprises determining that the reticle is contaminated if one or more debris particles have a height that is greater than a threshold height.

20. The method of claim 16, wherein cleaning the backside of the reticle includes removing the debris particle with the cleaning tip by maneuvering the cleaning tip to the height of the debris particle above the backside of the reticle.

* * * * *